United States Patent [19]
Case et al.

[11] Patent Number: 5,789,994
[45] Date of Patent: Aug. 4, 1998

[54] DIFFERENTIAL NONLINEAR TRANSMISSION LINE CIRCUIT

[75] Inventors: Michael G. Case, Thousand Oaks; Gopal Raghavan, Canoga Park, both of Calif.

[73] Assignee: Hughes Electronics Corporation, ElSegundo, Calif.

[21] Appl. No.: 797,542

[22] Filed: Feb. 7, 1997

[51] Int. Cl.[6] .................................................... H01P 5/00
[52] U.S. Cl. ................................................. 333/20; 327/181
[58] Field of Search ..................... 333/20, 164; 327/181; 307/106, 107

[56] References Cited

U.S. PATENT DOCUMENTS

| | | | |
|---|---|---|---|
| 3,958,131 | 5/1976 | Mozdzer | 307/106 |
| 4,855,696 | 8/1989 | Tan et al. | 333/20 |

OTHER PUBLICATIONS

Mark J.W. Rodwell, *Picosecond Electrical Wavefront Generation and Picosecond Optoelectronic Instrumentation*, Stanford University, 1987, pp. 33–57.

Michael Garth Case, *Nonlinear Transmission Lines for Picosecond Pulse, Impulse and Millimeter Wave Harmonic Generation*, University of California, Santa Barbara, 1993, pp. 27–58.

*Primary Examiner*—Paul Gensler
*Attorney, Agent, or Firm*—V. D. Duraiswamy; W. K. Denson-Low

[57] ABSTRACT

A differential nonlinear transmission line (NLTL) circuit has anti-parallel diode pairs along a balanced transmission line to generate well defined high-speed pulses with sharp positive and negative transitions from a time varying input signal. The input signal may carry an arbitrary DC bias voltage component that is suitable for digital logic circuits, such as current mode logic (CML) employing differential inputs.

16 Claims, 5 Drawing Sheets ns1,994

DIFFERENTIAL NONLINEAR TRANSMISSION LINE CIRCUIT

BACKGROUND OF THE INVENTION

1. Field of the Invention

This invention relates to a nonlinear transmission line circuit that generates fast electrical pulses, and more specifically to a nonlinear transmission line circuit with anti-parallel diode pairs.

2. Description of the Related Art

Nonlinear transmission lines (NLTLs) are passive circuits using nonlinear capacitance versus voltage (C/V) characteristics of semiconductor p-n or Schottky junctions imbedded in wave guiding structures to generate very fast voltage pulses. M. J. W. Rodwell, *Picosecond Electrical Wavefront Generation and Picosecond Optoelectronic Instrumentation*, Stanford University, 1987, pages 33–57, describes a conventional NLTL which is periodically loaded with diodes that are biased in the same direction and spaced substantially equally apart along the transmission line. The theory of pulse shaping using the nonlinear characteristics of the diodes in a conventional NLTL is described in M. G. Case, *Nonlinear Transmission Lines for Picosecond Pulse, Impulse and Millimeter-Wave Harmonic Generation*, University of California, Santa Barbara, 1993, pages 27–58.

A conventional NLTL is shown in FIG. 1, in which a transmission line 2 has a plurality of transmission line segments 4 of substantially equal line lengths. The locations at which adjacent line segments are joined are defined by respective nodes 6. A respective diode 8 is connected to each node 6 and is conductive in the direction from the node to ground. The diodes can be either p-n junction or Schottky diodes. A signal generator 10, one node 12 of which is grounded, supplies a substantially sinusoidal input voltage signal with a typical waveform as shown in FIG. 2a, from its active voltage node 14 to the transmission line 2. The signal generator 10 has a source impedance that is represented by a resistor 16. A load 18 is connected to receive a pulsed voltage signal, a typical waveform of which is shown in FIG. 2b, that is shaped by the diode-loaded transmission line 2. The positive portion of an input sinusoidal lobe is cut off because of the forward bias of the diodes. The slopes of the leading portions 21 of the pulses 19 are steepened as the signal travels through the transmission line, thereby forming pulses that have sharp transitions from nearly zero voltage to the negative peak voltage −V+. However, the trailing portions 23 from −V to zero voltage are not sharpened by the conventional NLTL of FIG. 1, and therefore the output waveform of FIG. 2b does not sufficiently approximate rectangular digital pulses.

The switching speed of a logic circuit is limited by the rise time, which is the time required to transition from a low state to a high state, and by the fall time, which is the time required to transition from a high state to a low state. The rise and fall times determine the sharpness of the pulse. Short rise and fall times make a pulse signal well defined in a digital data stream, and the signal is therefore less subject to the uncertainties of whether the voltage represents a "1" or a "0" when it is detected. The conventional NLTL described above sharpens the leading portion but not the trailing portion of a pulse. On the other hand, if the diodes are conductive in a direction reverse to that shown in FIG. 1, the trailing portion is sharpened but the leading portion is not. Therefore, a conventional NLTL can sharpen either the positive or the negative transition of a pulse, but not both.

Moreover, in high-speed digital circuits, a DC bias voltage is desirable and usually required to elevate a digital pulse waveform to a non-zero voltage level. If a positive DC bias voltage $V_{bias}$ is connected to the node 12 of the signal generator 10 in FIG. 1, and $V_{bias}$ is higher than V+ so that the voltage at the bottom of the sinusoidal lobe, i.e., $V_{bias}$−V+, is positive, the diodes are always forward biased. The fall from the peak to the bottom of the sinusoidal lobe is even more gradual, thereby prolonging the negative transition from "1" to "0". Therefore, the conventional NLTL is not feasible for supplying shaped digital pulses for differential amplifier circuits, or in other applications in which a bias voltage is required.

SUMMARY OF THE INVENTION

In view of the above problems, the present invention provides a differential NLTL that is a balanced transmission line loaded with anti-parallel pairs of semiconductor diodes, preferably implemented as base-emitter or collector-base junctions of bipolar transistors on integrated circuits, at selected locations along the transmission line to produce well defined near-rectangular pulses with sharp positive and negative transitions. The differential NLTL offers greatly reduced rise and fall times and generates high speed digital pulses that are suitable for high-speed digital logic, such as current mode logic (CML). Moreover, an arbitrary DC bias voltage, either positive or negative, can be applied to the input signal without affecting the differential NLTL circuit's pulse-shaping performance or functionality. The NLTL is well suited for generating sharply defined pulses for high speed digital circuits that employ differential signals and other circuits that require a DC-biased digital signal.

These and other features and advantages of the invention will be apparent to those skilled in the art from the following detailed description, taken together with the accompanying drawings, in which:

DETAILED DESCRIPTION OF THE INVENTION

The present invention provides a differential NLTL that is a balanced transmission line loaded with anti-parallel pairs of semiconductor diodes, preferably implemented as base-emitter or collector-base junctions of bipolar transistors on integrated circuits, to generate well defined near-rectangular pulses with sharp positive and negative transitions. The differential NLTL offers greatly reduced rise and fall times to retain a substantially rectangular pulse shape even if the pulse duration is very short. The differential NLTL is able to generate a differential pulse waveform that is biased to a positive or a negative DC voltage, and therefore is applicable to supplying digital pulses to a differential logic circuit. High speed digital pulses generated by the differential NLTL are suitable for fast current mode logic (CML) operations on a variety of integrated circuits.

Figure 3:
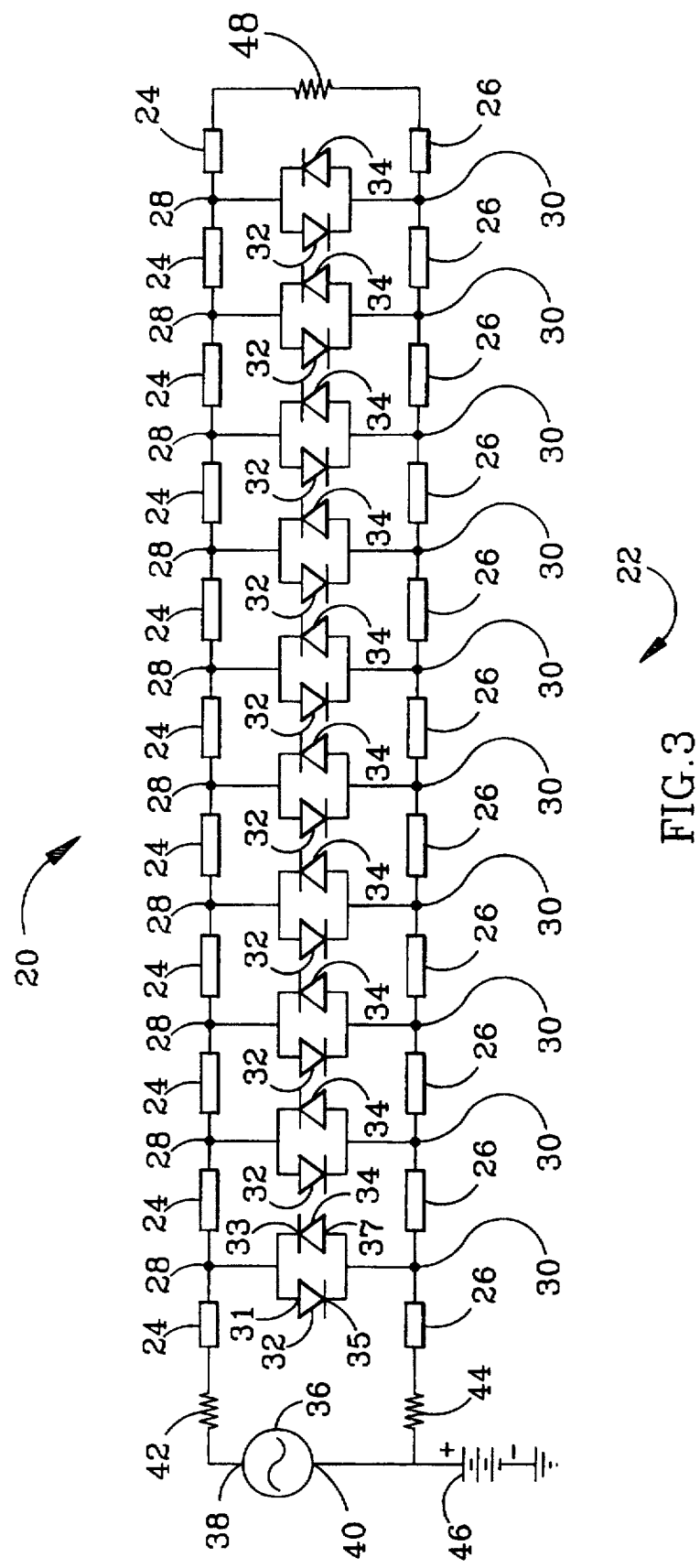
FIG. 3 is a circuit diagram of a differential NLTL in accordance with the invention.

FIG. 3 shows a preferred embodiment of the invention, in which a differential NLTL circuit has a balanced transmission line that comprises a pair of substantially identical conductive lines 20 and 22 in parallel with each other. The lines 20 and 22 each have a plurality of transmission line segments 24 and 26, respectively, preferably of substantially equal lengths. The locations at which adjacent line segments 24 are joined are defined by respective nodes 28, and the corresponding locations along the line 22 are defined by respective nodes 30. A respective pair of "anti-parallel" diodes 32 and 34 are connected between each pair of nodes 28 and 30. The anode 31 of the diode 32 is connected to the cathode 33 of the diode 34, which is connected to the node 28. Similarly, the cathode 35 of the diode 32 is connected to the anode 37 of the diode 34, which is connected to the node 30. Each diode 32 is conductive in the direction from its node 28 to its node 30, while each diode 34 is conductive in the direction from its node 30 to its node 28. Many such diode pairs are provided at different locations along the lines 20 and 22 to shorten the rise and fall times. The spacings between the diode pairs govern the minimum rise and/or fall times, but they need not be equal. The capacitance versus voltage (C/V) characteristics of the diodes 32 shorten the fall time of a pulse while the C/V characteristics of the diodes 34 shorten its rise time, thereby producing an output waveform with a substantially rectangular pulse shape.

A signal generator 36 generates an input signal and has two nodes 38 and 40 connected to transmit the signal to the respective conductive lines 20 and 22. The signal generator has a source impedance that is represented by resistors 42 and 44 connected between the signal generator's nodes 38, 40 and the lines 20, 22, respectively. The differential NLTL is typically supplied with an input signal that has a substantially sinusoidal waveform, which is relatively easy to generate at high frequencies, or a pulse waveform with gradual positive and negative transitions. A DC bias voltage supply 46 is preferably connected to the node 40 to provide a bias to the input signal. A differential voltage is the voltage between the lines 20 and 22. Although the DC voltage supply 46 in FIG. 3 has a positive bias voltage, the invention is also applicable to the pulse shaping of a differential voltage signal with a negative DC bias. The pulse shaping performance of the differential NLTL circuit is independent of the polarity or the level of the bias voltage. The input signal is progressively shaped by the anti-parallel diode pairs 32, 34 as it travels through the line pair 20, 22, to be transformed into an output digital pulse signal with sharp positive and negative transitions. The output signal is transmitted to a load such as a high-speed CML circuit, which has a load impedance represented by a resistor 48.

Figure 1:
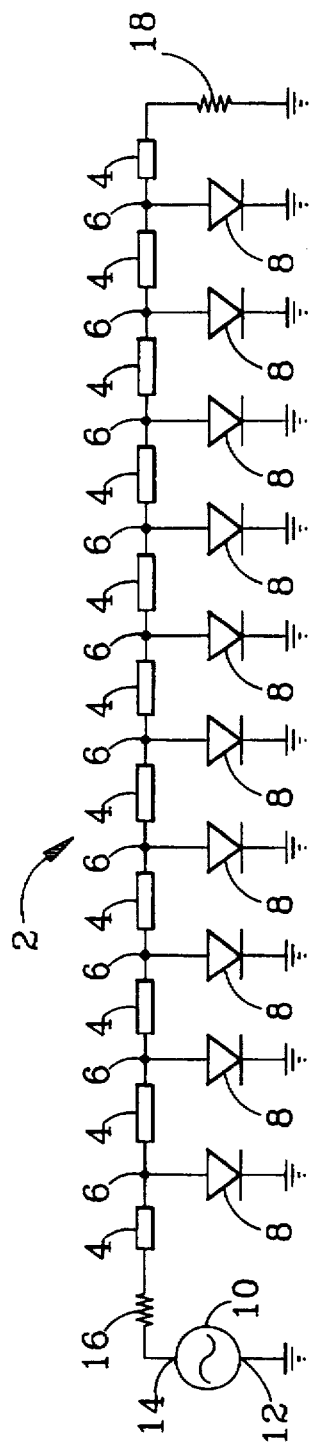
FIG. 1, described above, is a circuit diagram of a conventional NLTL.
Figure 2A:
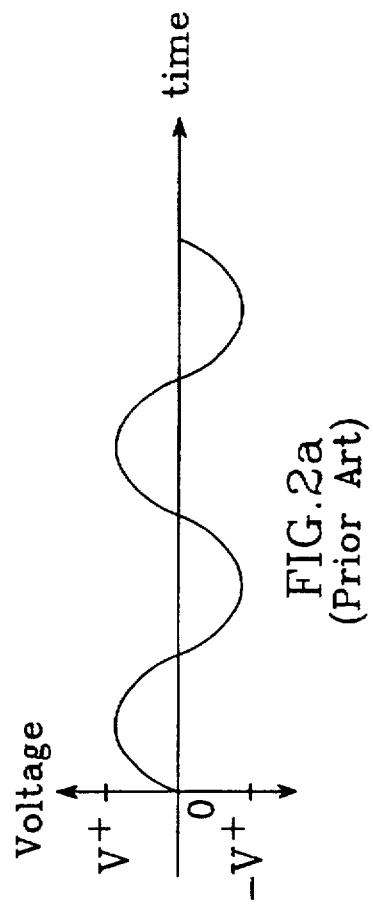
FIG. 2a, described above, is a plot of voltage v. time for a typical sinusoidal input voltage waveform.
Figure 2B:
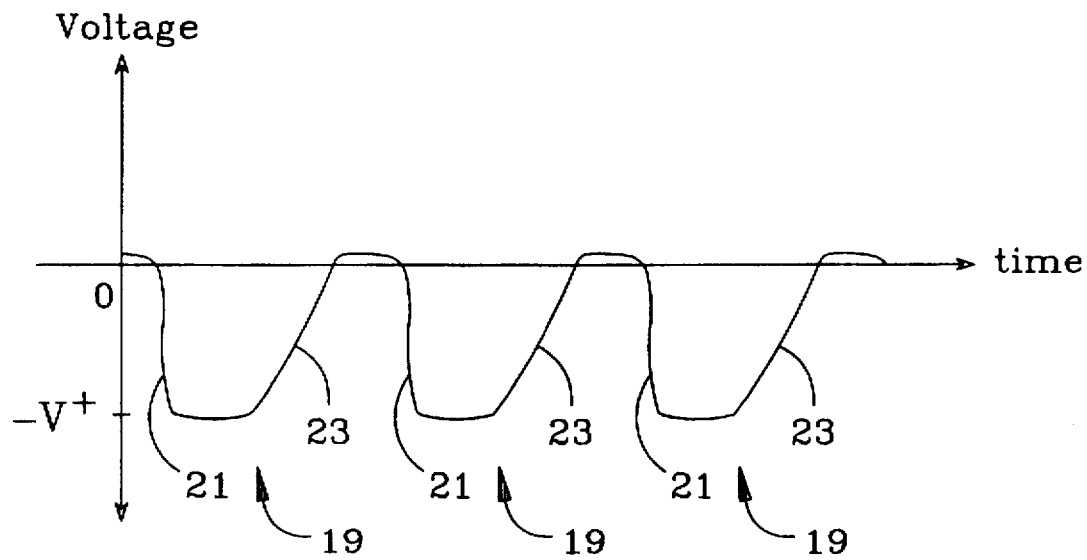
FIG. 2b, described above, is a plot of voltage v. time for a typical output voltage waveform that is shaped by the NLTL of FIG. 1.
Figure 4C:
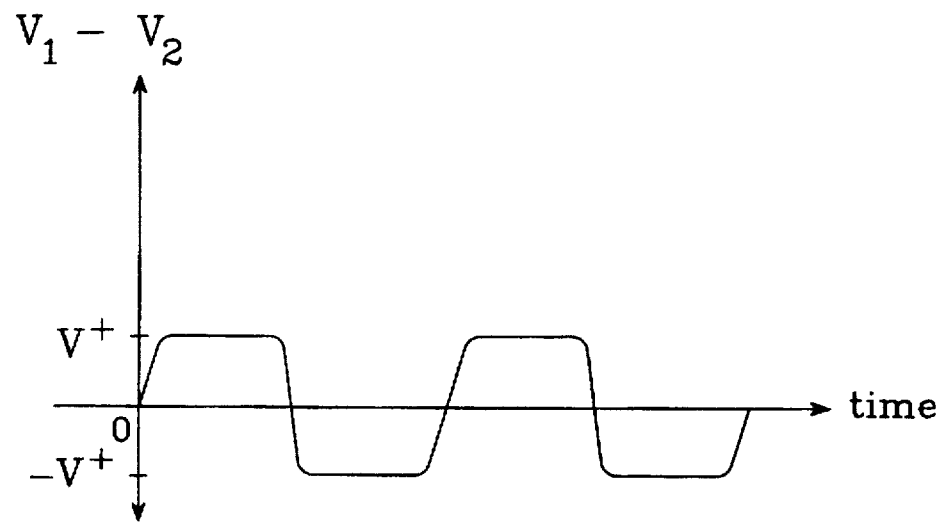
FIG. 4c is a plot of differential voltage $V_1-V_2$ v. time for the output voltage waveform of the differential NLTL.
Figure 4A:
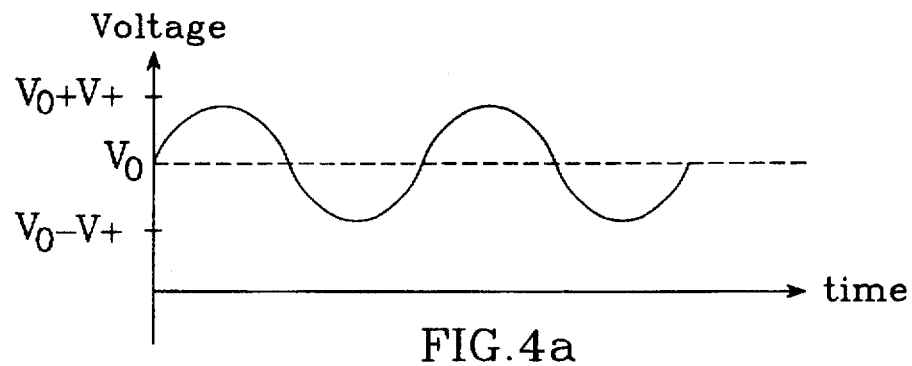
FIG. 4a is a plot of voltage v. time for a typical sinusoidal input voltage waveform with a positive DC bias voltage.
Figure 4B:
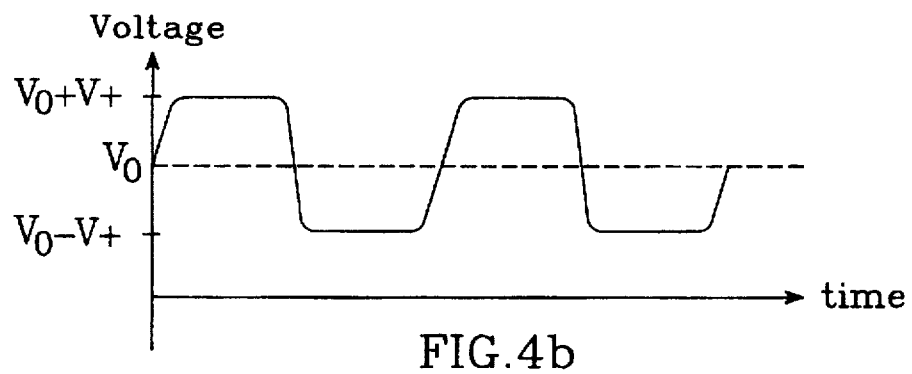
FIG. 4b is a plot of voltage v. time for a typical DC-biased output voltage waveform that is shaped by the differential NLTL of FIG. 3.

FIG. 4a shows a typical differential input signal waveform which is a sinusoid having a peak voltage V+ and is biased with a DC voltage $V_0$. As this input signal travels through the conductive line pair 20, 22, the positive slopes of the rising portion of the sinusoidal lobe are progressively steepened by the diodes 32, while the negative slopes of the rising portion of the sinusoidal lobe are progressively steepened by the diodes 34. A typical output signal, shown in FIG. 4b, has a substantially rectangular pulse waveform, with short rise and fall times and therefore relatively sharp positive and negative transitions. The bias voltage $V_0$ for the differential output waveform remains the same as for the input waveform, because the NLTL has no effect on the bias voltage. If conventional diodes are used, the sinusoidal peak voltage V+ is preferably in the range of about 50 mV to 0.75 V. Therefore, the maximum peak-to-peak voltage is about 1.5 V. The differential voltage between the balanced transmission line pair 20 and 22 has a signal waveform as shown in FIG. 4c. The bias voltage $V_0$ is not limited because the NLTL processes only the differential voltage signal; the voltage at any of the nodes relative to ground is not critical.

The differential NLTL circuit can be implemented with a variety of physical configurations. If the circuit is implemented on an integrated circuit, it is preferred that the conductive lines 20 and 22 in FIG. 3 be substantially identical parallel conductive strips deposited on a semiconductor substrate in a "balanced" transmission line configuration. With existing strip transmission line materials, the rise and fall times of a pulse shaped by the new NLTL are generally in the range of about 0.1–1 ps, and the maximum pulse repetition rate is on the order of 50 GHz, which is equivalent to a pulse duration of 20 ps. When the NLTL circuit is fabricated on an indium-phosphide (InP) based integrated circuit, it is preferred that base-emitter junctions of heterojunction bipolar transistors (HBTs) be used in place of the conventional diodes, because HBTs are easier to fabricate than diodes for large scale integration.

Figure 5A:
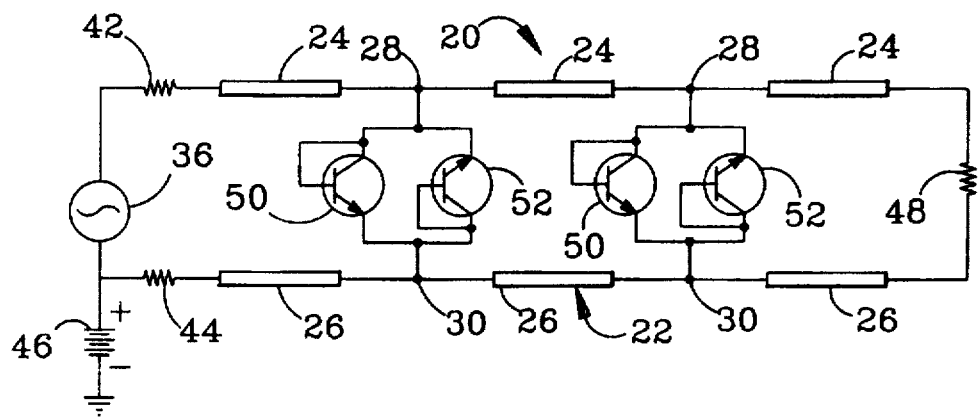
FIG. 5a is a circuit diagram of an embodiment of the differential NLTL implemented on a heterojunction bipolar transistor (HBT) integrated circuit.

FIG. 5a shows a preferred embodiment in which diode-connected pairs of HBTs 50, 52 have their bases shorted to their collectors so that their base-emitter junctions act as the p-n junctions of diodes, with the junctions positioned to provide a forward conductivity from the nodes 28 to the nodes 30 and from the nodes 30 to the nodes 28, respectively. The base and collector of each HBT 50 are connected together to a respective node 28, while its emitter is connected to a respective node 30. On the other hand, the base and the collector of each HBT 52 are connected together to a respective node 30, while its emitter is connected to a respective node 28. The base-emitter junctions have reverse-bias breakdown voltages generally in the range of about 1.5–2.0 V. The maximum peak-to-peak voltage 2V+ is about 1.5 V.

Figure 5B:
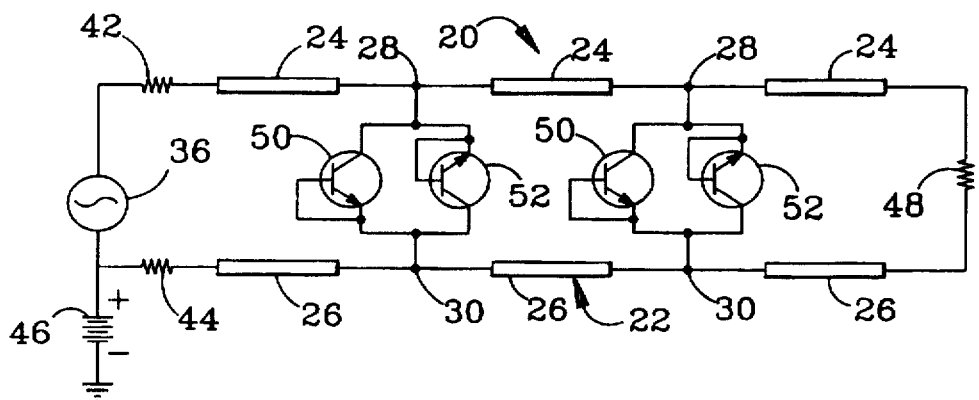
FIG. 5b is a circuit diagram of another embodiment the differential NLTL implemented on an HBT based integrated circuit.

Instead of base-emitter junctions, collector-base junctions can also be used in a differential NLTL circuit, a preferred embodiment of which is shown in FIG. 5b. The pairs of HBTs 50, 52 remain at the same locations as in FIG. 5a, but with the base of each HBT connected to its emitter instead of the collector. The maximum peak-to-peak voltage is about 2 V. Compared to the base-emitter junctions of FIG. 5a, the collector-base junctions have a higher reverse-bias breakdown voltage, generally in the range of about 3–4.5 V, which provides a relatively safe operating margin for the HBTs. Although base-emitter junction has more capacitance than a collector-base junction, the size of the base-emitter device can be adjusted to obtain an optimal capacitance.

Figure 6:
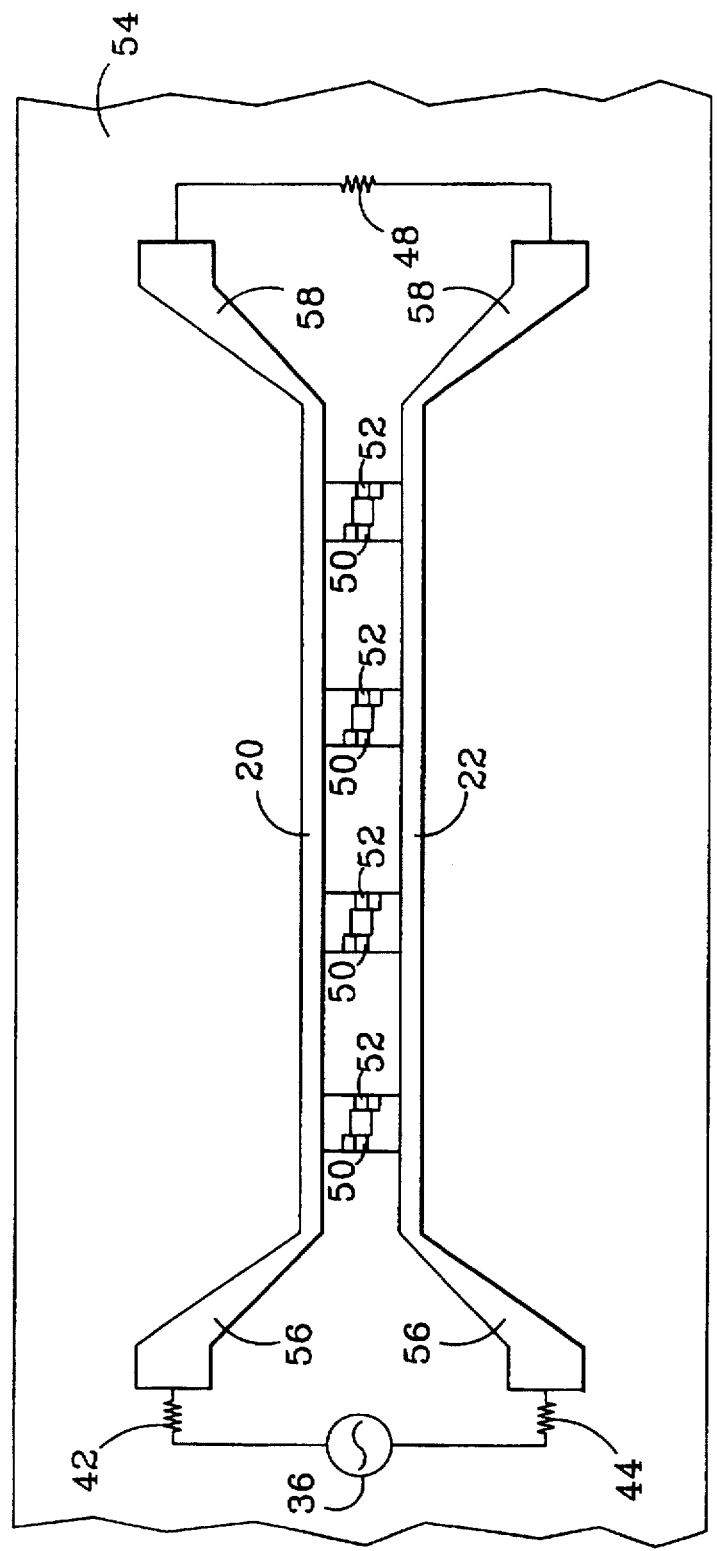
FIG. 6 is a simplified plan view of a differential NLTL circuit similar to FIG. 5b with coplanar strip lines, HBTs, and input and output transitions on a semiconductor integrated circuit substrate.

FIG. 6 shows a simplified plan view of a differential NLTL circuit similar to FIG. 5b on an integrated circuit's semiconductor substrate 54. Two parallel conductive strip lines 20, 22 with substantially identical widths are deposited on the substrate. The pairs of HBTs 50, 52 with collector-base junctions are fabricated on the substrate 54, and are connected between the lines 20 and 22 at substantially equally spaced locations similar to the circuit diagram of FIG. 5b, but with four HBT pairs instead of two. The HBT pairs 50, 52 are small in size compared to the transmission line lengths between the adjacent pairs, and are exaggerated for a detailed illustration. The conductive lines are progressively widened near the input and output ends of the lines in respective transitions 56 and 58 for testing of the NLTL by a microwave wafer probe pad.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A differential nonlinear transmission line, comprising:

a balanced transmission line formed by first and second conductive lines which are each divided into a plurality of line segments; and at least four diodes which each have an anode and a cathode;

wherein pairs of said diodes are differentially connected between said first and second conductive lines; accordingly, the anode of one diode of each pair and the cathode of another diode of that pair are connected to the same conductive line;

and wherein, on each of said conductive lines, each one of said pairs is separated from an adjacent one of said pairs by one of said line segments.

2. The differential nonlinear transmission line of claim 1, further comprising a signal generator connected to transmit to said transmission line a time varying input voltage signal that is characterized by alternating rise and fall times, said diodes shortening said rise and fall times as said input signal is transmitted through said transmission line to generate an output pulse signal.

3. The differential nonlinear transmission line of claim 2, wherein said signal generator generates a substantially sinusoidal waveform.

4. The differential nonlinear transmission line of claim 2, further comprising a DC voltage supply connected to provide a DC bias voltage to said input signal.

5. The differential nonlinear transmission line of claim 1, wherein said diodes comprise Shottky diodes.

6. The differential nonlinear transmission line of claim 1, wherein said diodes comprise p-n junction devices.

7. The differential nonlinear transmission line of claim 6, wherein said p-n junction devices comprise base-emitter junctions of bipolar transistors.

8. The differential nonlinear transmission line of claim 6, wherein said p-n junction devices comprise collector-base junctions of bipolar transistors.

9. The differential nonlinear transmission line of claim 1, further including a load impedance coupled between said first and second conductive lines at an end of said transmission line.

10. The differential nonlinear transmission line of claim 1, wherein said line segments have substantially equal lengths.

11. The differential nonlinear transmission line of claim 1, wherein each of said diodes is formed from a junction of a bipolar transistor.

12. The differential nonlinear transmission line of claim 11, wherein said bipolar transistor has an emitter, a collector, and a base that is coupled to said collector.

13. The differential nonlinear transmission line of claim 11, wherein said bipolar transistor has an emitter, a collector, and a base that is coupled to said emitter.

14. The differential nonlinear transmission line of claim 11, wherein said bipolar transistor is a portion of an integrated circuit that has a semiconductor substrate and said balanced transmission line is carried on said substrate.

15. The differential nonlinear transmission line of claim 14, wherein said bipolar transistor is a heterojunction bipolar transistor.

16. The differential nonlinear transmission line of claim 14, wherein said integrated circuit is an indium-phosphide integrated circuit.

* * * * *